United States Patent
Kodra

(10) Patent No.: US 10,760,963 B2
(45) Date of Patent: Sep. 1, 2020

(54) METHOD FOR ELECTROMAGNETIC ENERGY SENSING AND A CIRCUIT ARRANGEMENT

(71) Applicant: ams International AG, Rapperswil (CH)

(72) Inventor: Gregg Kodra, Austin, TX (US)

(73) Assignee: ams International AG, Rapperswil (CH)

( * ) Notice: Subject to any disclaimer, the term of this patent is extended or adjusted under 35 U.S.C. 154(b) by 92 days.

(21) Appl. No.: 16/038,079

(22) Filed: Jul. 17, 2018

(65) Prior Publication Data

US 2019/0025118 A1    Jan. 24, 2019

Related U.S. Application Data

(60) Provisional application No. 62/534,034, filed on Jul. 18, 2017.

(30) Foreign Application Priority Data

Aug. 1, 2017    (EP) .................................... 17184308

(51) Int. Cl.
*G01J 1/46* (2006.01)
*G01R 29/24* (2006.01)
*G01J 1/44* (2006.01)

(52) U.S. Cl.
CPC ................ *G01J 1/46* (2013.01); *G01R 29/24* (2013.01); *G01J 2001/4426* (2013.01)

(58) Field of Classification Search
CPC ...... G01J 1/46; G01J 2001/4426; G01R 29/24
See application file for complete search history.

(56) References Cited

U.S. PATENT DOCUMENTS

| 4,320,289 A * | 3/1982 | White ................. G01J 1/4204 250/214 R |
| 5,153,502 A | 10/1992 | Morgan et al. |
| 5,892,585 A | 4/1999 | Lianza et al. |
| 2015/0260570 A1 | 9/2015 | Jung |
| 2016/0285444 A1 | 9/2016 | Denham et al. |

FOREIGN PATENT DOCUMENTS

DE    102005047271 A1    2/2007

* cited by examiner

*Primary Examiner* — Georgia Y Epps
*Assistant Examiner* — Don J Williams
(74) *Attorney, Agent, or Firm* — Fish & Richardson P.C.

(57) ABSTRACT

A circuit arrangement comprises a photo detector (2) for detecting electromagnetic energy and a signal generating means (4, 6, 12, 16) being suitable for generating a sequence of events wherein an event interval of the sequence depends on the detected electromagnetic energy. The signal generating means (4, 6, 12, 16) is coupled downstream of the photo detector (2). A counting means (30, 32, 34, 36) for measuring a time period until a given number of events has been generated is coupled downstream of the signal generating means (4, 6, 12, 16).

12 Claims, 2 Drawing Sheets

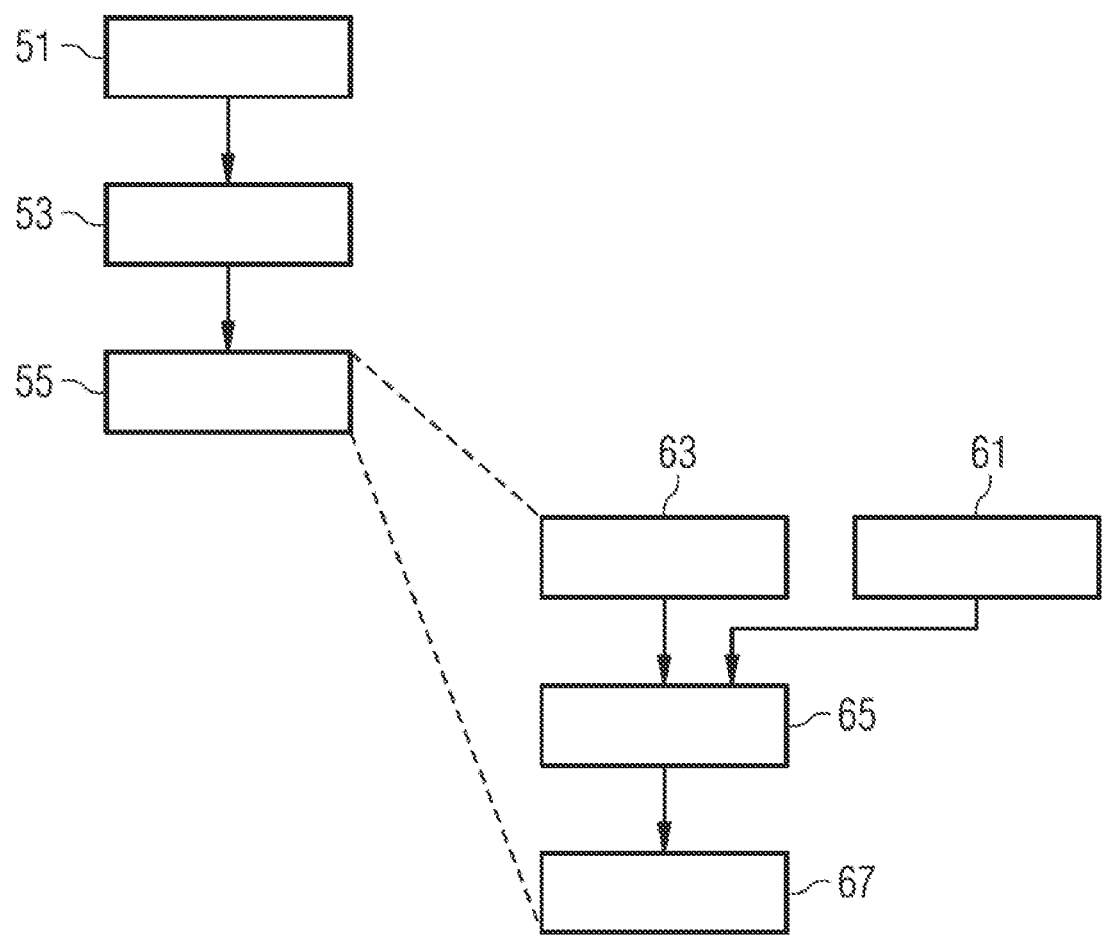

METHOD FOR ELECTROMAGNETIC ENERGY SENSING AND A CIRCUIT ARRANGEMENT

CROSS-REFERENCE TO RELATED APPLICATIONS

The present application claims the benefit of priority under 35 U.S.C. § 119 from U.S. Provisional Patent Application No. 62/534,034 filed on Jul. 18, 2017, and claims priority to European Patent Application 17184308.9 filed on Aug. 1, 2017, both disclosures of which are hereby incorporated by reference in their entirety for all purposes.

TECHNICAL FIELD

The invention relates to a method for electromagnetic energy sensing, e.g. light sensing, and a circuit arrangement therefor.

BACKGROUND

Electromagnetic energy sensing may include electromagnetic energy to frequency conversion. This type of electromagnetic energy sensing may be used for light sensing. Light is electromagnetic radiation within a certain portion of the electromagnetic spectrum; light includes ultraviolet light, visible light and infrared light.

A light-to-frequency circuit arrangement, which may also be called light-to-frequency engine, used in a light sensor may have two main components. There is an analog circuit comprising a photo diode and an integrating feedback loop that converts light into a series of pulses. This set of pulses is counted over a fixed period of time by a digital circuit. The number of pulses generated within the fixed period indicates the light intensity. Light-to-frequency converters may be used in applications such as ambient light measurement, light absorption/reflection in products such as white goods, photographic equipment, colorimetry, chemical analyzers and display contrast controls.

Improving the effective resolution of light-to-frequency converters for low light levels for the above-mentioned architecture may be achieved by increasing analog gain and/or increasing the diode area. These approaches may also be used for other architectures. Increasing the low light sensitivity may be achieved by increasing the analog front end gain. This has the side effect of saturation at a lower light level.

It is an aim of the invention to improve the effective resolution of a light-to-frequency converter for low light levels in an alternative way. This is especially important in spectroscopy applications that use a relatively low intensity narrow band source. In these applications, a small spectral response is expected in a different narrow band.

SUMMARY

The method for electromagnetic energy sensing, wherein light sensing may be one form of electromagnetic energy sensing, according to independent claim 1 comprises detecting electromagnetic energy, generating a sequence of events wherein an event interval of the sequence depends on the detected electromagnetic energy, measuring a time period until a given number of events has been generated and providing the time period as an output value.

The interval is the time space between two successive events. The way of counting according to the above-mentioned method differs from conventional approaches; the method allows higher accuracy for low light conditions. The events are counted until a given number of events has been generated and the time period until this given number has been generated is measured, which differs from the conventional counting approach wherein the number of events during a given time period is determined. The inventive method allows a finer resolution since the time period ends immediately after the last one of the given number of events has been generated. Contrary to the inventive approach, the conventional approach has an imminent uncertainty since the number of events within a given interval is associated with larger quantization than determining and measuring a time period per se.

The method uses a non-fixed time integrating feedback loop, which allows improvement of the dynamic range of a light-to-frequency converter. Light-to-frequency converters may be used in applications such as ambient light measurement, light absorption/reflection in products such as white goods, photographic equipment, colorimetry, chemical analyzers and display contrast controls.

Detecting electromagnetic energy may comprise converting the electromagnetic energy into a current, which may be achieved by means of a photodiode. The current depends on the electromagnetic energy.

Generating the sequence of events may comprise integrating the current by charging an integrating capacitor of an integrator amplifier. If the integrated current reaches or exceeds a given threshold, one event will be generated and the capacitor will be discharged. The events, which may be signal pulses, can be generated by means of a flip-flop that samples the output values of an analog front-end of the circuit arrangement; the analog front-end includes the integrator amplifier.

Measuring the time period usually means measuring clock cycles. It may comprise incrementing a time value in dependence of a clock signal, which may be achieved by a clocked incrementing counter serving as a timer. The time value may be a counting up integer value. In other words, the time value is counted up with every cycle of the clock signal, whereby the time value is suitable for indicating a time interval.

While incrementing the time value, the events are counted and the count value is compared with the given number. When the count value has reached or exceeded the given number, the time value is evaluated and provided as an output value, which may be achieved by triggering an enabling input of the incrementing counter.

A circuit arrangement operating according to the above-mentioned method comprises a photo detector for detecting electromagnetic energy and a signal generating means being suitable for generating a sequence of events wherein an event interval of the sequence depends on the detected electromagnetic energy. The signal generating means is coupled downstream of the photo detector. A counting means for measuring a time period until a given number of events has been generated is coupled downstream of the signal generating means. It has an output for providing the measured time period as an output value.

The counting means is a digital circuit. This approach is a digital solution rather than an analog one, which really distinguishes it from the conventional approaches for improving a light-to-frequency converter. The circuit arrangement increases the effective resolution without increasing the die area, which the conventional analog approaches do.

This invention has the advantage that it does not decrease the maximum light the system can digitalize before the saturating effect would occur caused by analog changes.

In one embodiment, the photo detector comprises a photodiode, which converts electromagnetic energy, e.g. light, into a current. The signal generating means may comprise an integrator amplifier, a comparator having a first input coupled to the integrator amplifier and a second input for applying a reference voltage. The signal generating means further comprises a signal event generator coupled downstream of an output of the comparator; the signal event generator is suitable for generating an event when triggered by the comparator. The integral amplifier comprises an operational amplifier and an integrating capacitor coupled between an input and an output of the operational amplifier. The integrating capacitor is charged by the current of the photodiode. The comparator may comprise a differential amplifier which detects whether a voltage provided at an output of the operational amplifier and dependent on the integrated current has already reached or exceeded a reference voltage. In this case, the comparator triggers the signal event generator. The triggering signal may be a signal transfer from one voltage level to another voltage level. The signal event generator may be embodied as a flip-flop where an input signal propagates through the flip-flop circuit when triggered by a clock signal.

Resetting means for resetting the integrator amplifier may be coupled to the signal event generator in such a way that the integrator amplifier is reset when one event is generated. Resetting causes discharging of the integrating capacitor; thereby the output of the comparator goes back to its original voltage level again, which causes the signal event generator to provide a pulse-shaped event. In other words, one event is a signal transfer between two logical levels forming a signal pulse. The signal goes up when reaching or exceeding the reference voltage and then goes back to its initial logical level or vice versa.

In one embodiment the counting means comprises an event counter having an input coupled to the signal event generator and a further comparator having a first input coupled to an output of the event counter and a second input coupled to a register suitable for providing the given number of events. The event generator counts the number of events that have been generated by the signal event generator. The further comparator detects whether the counted pulses have already reached or exceeded the given number stored in the register. If so, the comparator provides a signal which may be a logical signal transfer, e.g. from LOW to HIGH or vice versa.

The counting means preferably comprises an incrementing counter having an enable input coupled to an output of the further comparator; the latter is able to generate a trigger signal when the counted pulses have reached or exceeded the given number. The incrementing counter is suitable for counting time pulses of a clock signal applied to a clock input and evaluate and provide the amount of counted time pulses when triggered at the enable input. The incrementing counter serves as a timer that counts up with every cycle of the clock signal. Once triggered at the enable input, the evaluated value indicates the time period until the given number of events has been generated.

The event counter, the incrementing counter and the further comparator are embodied as digital electronic circuits. A clock generator connected to the clock input of the incrementing counter as well as to the event counter, the further comparator and the flip-flop synchronises operation of the digital circuit components.

BRIEF DESCRIPTION OF THE DRAWINGS

Non-limiting, exemplary embodiments of the invention will now be described with reference to the accompanying drawings, in which:

FIG. 3 illustrates a method for electromagnetic energy sensing.

Figure 1:
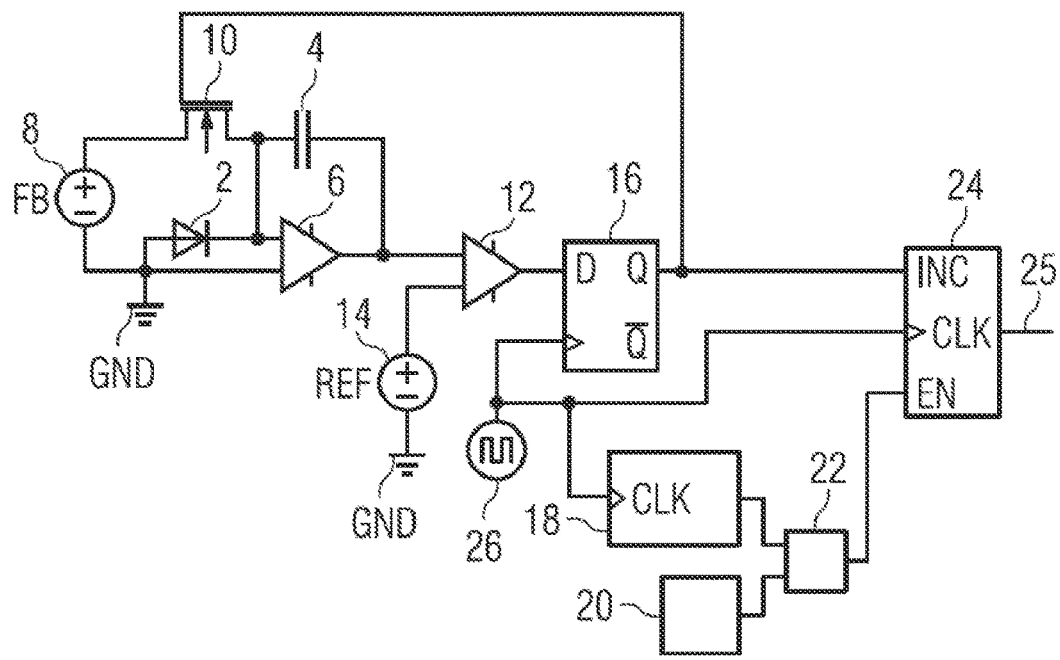
FIG. 1 shows a block diagram of an embodiment of a conventional circuit arrangement for light sensing.

REFERENCE NUMERALS 2 photo detector
4 capacitor
6 operational amplifier
8, 14 voltage source
10 switch
12 differential amplifier
16 flip-flop
18, 24, 30, 36 counter
20, 32 register
22, 34 comparator
25, 37, Q output
26 clock generator
51, 53, 55, 61, 63,
65, 67 step
CLK, D INC, EN input
FB, REF voltage

DETAILED DESCRIPTION

FIG. 1 shows a block diagram of an embodiment of a conventional circuit arrangement for light sensing.

The circuit arrangement comprises a photo detector 2 that may be embodied as a photodiode. The photo detector 2 is a sensor of light or other electromagnetic energy which provides a current in dependence of the light intensity or the electromagnetic energy. The photo detector 2 may be considered as a light-to-current converter. The circuit arrangement further comprises an operational amplifier 6 and an integrating capacitor 4; the latter is coupled between an input and an output of the operational amplifier 6. Another input of the operational amplifier 6 is connected to ground GND. The photo detector 2 is connected to the same input as the integrating capacitor 4. The operational amplifier 6 and the integrating capacitor 4 form an integrator amplifier, where the integrating capacitor 4 may be charged by the current of the photo detector 2.

A feedback mechanism comprises a voltage source 8 and a switch 10 coupled in series between ground GND and the input of the operational amplifier 6 to which the integrating capacitor 4 is connected. The feedback mechanism allows discharging the integrating capacitor 4 if the switch 10 is in a conducting state; thereby a given feedback voltage VB provided by a voltage source 8 is applied to the integrating capacitor 4. If the switch 10 is in a non-conducting state, the integrating capacitor 4 may be charged by the current of the photo detector 2.

A comparator 12 is connected downstream of the integrator amplifier 4, 6. The comparator 12, which may be embodied as a differential amplifier, has a first input coupled to the output of the operational amplifier 6 and a second input for applying a reference voltage REF which is provided by a reference voltage source 14. The voltage at the first input depends on the voltage across the integrating capacitor 4. When the voltage reaches or exceeds a given threshold value, which is the reference voltage REF, there is a signal transition at the comparator's output. This may be a signal transition from a low voltage level to a high voltage level.

A flip-flop 16, preferably a D flip-flop, is connected downstream of the comparator 12. The flip-flop 16 serves as a signal generating means and allows clock-controlled direct transfer of data from an input D to an output Q of the flip-flop 16. The output Q provides either a first state LOW, which may indicate a low voltage level, or a second state HIGH, which may indicate a high voltage level. A clock generator 26 applies a clock signal to the flip-flop 16. The clock frequency may be 730 kHz, for example.

Once the signal at the comparator's output has changed, the state at the output Q of the flip-flop 16 also changes. Since the output Q is connected to the switch 10, the latter also switches, thereby discharging the capacitor 4. Then the voltage at the output of the operator amplifier 6 changes as well as the voltage at the output of the comparator 12, which causes again a state transition at the output Q of the flip-flop 16. Thus a pulse at the flip-flop's output Q is generated when a certain amount of light has been detected. During light detection a sequence of pulses is generated; the frequency of the sequence depends on the intensity of the detected light. The higher the intensity, the higher is the frequency. In other words, the lower the intensity, the larger is the interval between the pulses.

The number of pulses within a given time interval is detected by the following digital circuit arrangement comprising a first counter 18, a second counter 24, a further comparator 22 and an integer time register 20. The first counter 18 and the integer time register 20 are connected to inputs of the further comparator 22. The first counter 18 is an incrementing counter that counts up with every cycle of the clock signal applied to a clock input CLK of the first counter 18.

The output of the further comparator 22 is connected to an enable input EN of the second counter 24 serving as an event counter. The output Q of the flip-flop 16 is connected to an increment input INC of the second counter 24. The clock signal is applied to a clock input CLK of the second counter 24. The second counter 24 counts up when triggered at the increment input INC and stops and evaluates the count value when triggered at the enable input EN.

The first counter 18 counts up in dependence of the clock signal during a given time interval; thus it serves as a timer. The further comparator 22 compares whether the first counter 18 has reached a given time value provided by the integer time register 20. If this happens, the further comparator 22 triggers the enable input EN of the second counter 24. While the first counter 18 counts up, the second counter 24 counts the number of pulses generated by the flip-flop 16. When the second counter 24 is triggered at the enable input EN at the end of the given time interval, the number of pulses counted so far, which is provided at the output 25 of the second counter 24, indicates the intensity of the detected light. The higher the light intensity, the higher is the count.

Figure 2:
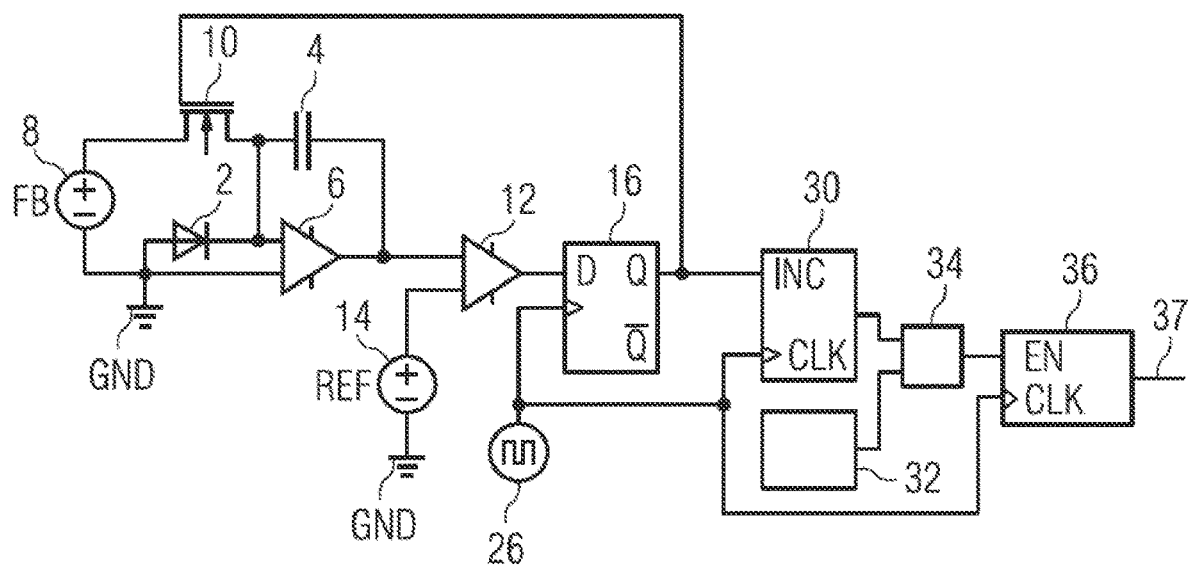
FIG. 2 shows a block diagram of an embodiment of a circuit arrangement for electromagnetic energy sensing, e.g. light sensing, according to the invention.

FIG. 2 shows a block diagram of an embodiment of a circuit arrangement for electromagnetic energy or light sensing according to the invention.

Pulse generation by means of the flip-flop 16 and its upstream components forming the analog front-end is performed in the same manner as described in connection with FIG. 1. To avoid duplication of information, coupling and functions of the photo detector 2, which may detect electromagnetic energy, of the integrator amplifier 4, 6, the comparator 12, the feedback mechanism 8, 10 and the flip-flop 16 will not be described again.

However, the digital circuit is different. The invention changes the digital circuit to count the amount of time needed to produce a fixed number of pulses.

The digital circuit arrangement serving as a counting means comprises a first counter 30 that serves as an event counter, a terminal count register 32, a further comparator 34 and a second counter 36 which is an incrementing counter serving for simple time keeping.

The amount of circuitry added by this additional digital configuration is minimal because there already is a counter for the count number in the conventional approach. A comparator 34 needs to be added. A register 32 also needs to either be added or repurposed for the terminal count.

An increment input INC of the first counter 30 is connected downstream of the output Q of the flip-flop 16. An output of the first counter 30 and the terminal count register 32 are connected to inputs of the further comparator 34. An output of the further comparator 34 is connected to an enable input EN of the second counter 36. The clock signal provided by the clock generator 26, which has already been described in connection with FIG. 1, is applied to clock inputs CLK of the first and second counters 30, 36.

The second counter 36 counts up in dependence of the clock signal; thereby it serves as a time keeper measuring the time until the enable input is triggered.

Once a triggering event, i.e. a pulse, is applied to the increment input INC of the first counter 30, it counts up; thereby the pulses generated by the flip-flip 16 are counted. The further comparator 34 compares whether the first counter 30 has reached a given number of pulses that is provided by the terminal count register 32. If this happens, the further comparator 34 triggers the enable input EN of the second counter 36. Its current value is provided as an output value at the output 37. The output value indicates the time period until the given number of events has been generated. The higher the intensity, the lower the output value.

The circuit arrangement in FIG. 2 is suitable for performing the following method for electromagnetic energy sensing as illustrated in FIG. 3. The method comprises the following steps: Detecting electromagnetic energy by means of the photodetector 2, which is illustrated by step 51, generating a sequence of events, which is illustrated by step 53, measuring a time period until a given number of events has been generated and providing the time period as an output value, which is illustrated by step 55.

Detecting electromagnetic energy comprises converting the electromagnetic energy into a current. Generating the sequence of events comprises integrating the current by charging the capacitor 4 of the integrator amplifier 4, 6 and generating one event and discharging the capacitor 4 if the integrated current reaches or exceeds a given threshold. When generating a sequence of events by means of the integrator amplifier 4, 6, the comparator 12 and the signal event generator 16, an event interval of the sequence depends on the detected electromagnetic energy.

Measuring the time period comprises the following steps.

A time value is incremented in dependence of the clock signal, as illustrated in step 61, which is performed by the up-counting second counter 36. While incrementing the time value, the events are counted and the count value is compared with the given number, as illustrated in step 63, which is performed by the first counter 30, the register 32 and the further comparator 34. The time value is evaluated when the count value has reached or exceeded the given number, as illustrated in step 65, which is performed by the second counter 36 when triggered by the comparator 34. The evaluated time value is provided as an output value at the second counter's output 37, as illustrated in step 67.

The following calculations show the benefit of the above-mentioned way of electromagnetic energy or light sensing.

Considering the conventional measurement, for an exemplary programmed integration time of 179.3 μS the integration counter will count for $(2^{16}-1)$ or 65536 clock cycles. An average of 648.87 to 655.36 clocks per feedback event will produce a pulse count of 100. An average of less than 648.87 would produce a final pulse count of 101 and an average of greater than 655.36 would produce a final pulse count of 99. The point at which the count reaches 100 could be 64887 and 65536 or in between, given a constant diode current. The difference in average diode current to produce a final count of 100 being reached at 64887 and 65536 clocks is (65536−64887)/65536 or 1.0%.

Coming to the inventive measurement, if we know the number of clock cycles at which 100 counts is achieved, we can realize an increase in resolution of 1/649 (65536−64887) since the exact time value of the integration counter is taken into account. It is important to note that the increased resolution is not linear. As the average current increases, the resolution gain decreases.

In the case of multiple channels additional logic would have to be added if the light had to be sampled by all sensors over the same period. Alternatively, light sampling for multiple channels could be done sequentially.

The scope of protection is not limited to the examples given herein above. The invention is embodied in each novel characteristic and each combination of characteristics, which particularly includes every combination of any features which are stated in the claims, even if this feature or this combination of features is not explicitly stated in the claims or in the examples.

The invention claimed is:

1. A method for electromagnetic energy sensing comprising:
    detecting electromagnetic energy, wherein detecting electromagnetic energy comprises converting the electromagnetic energy into a current,
    generating a sequence of events, wherein successive events of the sequence of events are separated in time by an event interval, wherein the event interval depends on the detected electromagnetic energy, and wherein generating the sequence of events comprises:
        integrating the current by charging a capacitor, and
        responsive to the integrated current reaching or exceeding a given threshold:
            generating one event, and
            discharging the capacitor,
    measuring a time period until a given number of events has been generated, wherein measuring the time period comprises counting a number of the events and comparing the counted number with the given value stored in a register, wherein the given number of events is greater than one, and
    providing the time period as an output value.

2. The method according to claim 1,
wherein measuring the time period comprises:
    incrementing a time value in dependence of a clock signal,
    while incrementing the time value, counting the number of the events and comparing the counted number with the given number,
    evaluating the time value when the counted number has reached or exceeded the given number, and
    providing the evaluated time value as an output value.

3. The method according to claim 1,
wherein the event is a signal pulse.

4. A circuit arrangement comprising:
    a photo detector operable to detect electromagnetic energy, wherein detecting electromagnetic energy comprises converting the electromagnetic energy into a current,
    a signal generating circuit operable to generate a sequence of events, wherein successive events of the sequence of events are separated in time by an event interval, wherein the event interval depends on the detected electromagnetic energy, wherein the signal generating circuit is coupled downstream of the photo detector, and
        wherein generating the sequence of events comprises:
            integrating the current by charging a capacitor, and
            responsive to the integrated current reaching or exceeding a given threshold:
                generating one event, and
                discharging the capacitor, and
    a counting circuit operable to measure a time period until a given number of events has been generated, wherein measuring the time period comprises counting a number of the events and comparing the counted number with the given value stored a register.

5. The circuit arrangement according to claim 4,
wherein the photo detector comprises a photodiode.

6. The circuit arrangement according to claim 4,
wherein the signal generating circuit comprises:
    an integrator amplifier,
    a comparator having a first input coupled to the integrator amplifier and a second input operable to apply a reference voltage, and
    a signal event generator coupled downstream of an output of the comparator, the signal event generator being operable to generate an event when being triggered by the comparator.

7. The circuit arrangement according to claim 6,
further comprising a resetting circuit operable to reset the integrator amplifier, the resetting circuit being coupled to the signal event generator in such a way that the integrator amplifier is reset when one event is generated.

8. The circuit arrangement according to claim 6,
wherein the counting circuit comprises:
    an event counter having an input coupled to the signal event generator, and
    a further comparator having a first input coupled to an output of the event counter and a second input coupled to the register.

9. The circuit arrangement according to claim 8,
wherein the counting circuit comprises an incrementing counter having an enable input coupled to an output of the further comparator, the incrementing counter being operable to count time pulses of a clock signal applied to a clock input and evaluate and provide the amount of counted time pulses when triggered at the enable input.

10. The circuit arrangement according to claim 9,
further comprising a clock generator connected to the clock input of the incrementing counter.

11. The circuit arrangement according to claim 9,
wherein the event counter, the incrementing counter and the further comparator are embodied as digital electronic circuits.

12. The circuit arrangement according to claim 4, wherein an event is a signal transfer between two logical levels forming a signal pulse.

* * * * *